(12) United States Patent
BrightSky et al.

(10) Patent No.: US 8,614,117 B2
(45) Date of Patent: Dec. 24, 2013

(54) SELF-ALIGNED PROCESS TO FABRICATE A MEMORY CELL ARRAY WITH A SURROUNDING-GATE ACCESS TRANSISTOR

(75) Inventors: Matthew J. BrightSky, Essex Junction, VT (US); Chung H. Lam, Peekskill, NY (US); Gen P. Lauer, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 13/369,246

(22) Filed: Feb. 8, 2012

(65) Prior Publication Data

US 2013/0200330 A1    Aug. 8, 2013

(51) Int. Cl.
  *H01L 29/02*    (2006.01)
(52) U.S. Cl.
  USPC ............... 438/102; 438/103; 438/104; 257/2; 257/3; 257/4; 257/5; 257/E29.002
(58) Field of Classification Search
  USPC .................... 257/2–5, E29.002; 438/102–104
  See application file for complete search history.

(56) References Cited

U.S. PATENT DOCUMENTS

| 5,574,299 A | 11/1996 | Kim | 257/296 |
| 6,440,801 B1 | 8/2002 | Furukawa et al. | 438/272 |
| 6,476,434 B1 | 11/2002 | Noble et al. | 257/302 |
| 7,586,149 B2 | 9/2009 | Yoon et al. | 257/329 |
| 7,776,692 B2 | 8/2010 | Yoon et al. | 438/270 |
| 7,800,093 B2 | 9/2010 | Happ et al. | 257/4 |
| 7,851,842 B2 | 12/2010 | Cho | 257/302 |
| 2001/0053089 A1* | 12/2001 | Noble | 365/154 |
| 2008/0173936 A1 | 7/2008 | Yoon | 257/329 |
| 2008/0283907 A1 | 11/2008 | Takaishi | 257/328 |
| 2010/0295123 A1 | 11/2010 | Lung et al. | 257/334 |
| 2011/0217818 A1* | 9/2011 | Lung et al. | 438/238 |
| 2011/0305074 A1* | 12/2011 | Lung et al. | 365/163 |

FOREIGN PATENT DOCUMENTS

JP    2008311641 A    12/2008    ........ H01L 21/8242

* cited by examiner

*Primary Examiner* — Jami M Valentine
(74) *Attorney, Agent, or Firm* — Ido Tuchman; Vazken Alexanian

(57) ABSTRACT

A memory array including a plurality of memory cells. Each word line is electrically coupled to a set of memory cells, a gate contact and a pair of dielectric pillars positioned parallel to the word line and placed on both sides of the gate contact over a layer of insulating material. Also a method to prevent a gate contact from electrically connecting to a source contact for a plurality of memory cells on a substrate. The method includes formation of a pair of pillars over an insulating material on the substrate, depositing an electrically conductive gate material between and over the pillars, etching the gate material such that it both partially fills a space between the pair of pillars and forms a word line for the memory cells, and depositing a gate contact between the dielectric pillars such that the gate contact is in electrical contact with the gate material.

15 Claims, 5 Drawing Sheets

SELF-ALIGNED PROCESS TO FABRICATE A MEMORY CELL ARRAY WITH A SURROUNDING-GATE ACCESS TRANSISTOR

BACKGROUND

This invention relates to arrays of memory cells. Modern manufacturing techniques make it possible to pack more memory cells on a given area of substrate. Newer types of memory, such as Phase Change Memory cells, need a large amount of current to operate. This in turn has given rise to transistors, such as vertical access transistors, that allow for a large amount of current to be delivered to a relatively small area.

The confluence of high current densities and memory cells packed into relatively small areas has resulted in configurations and methods of manufacture that can accommodate them. One development has been the use of a self-alignment fabrication technique that allows structure to be formed on the substrate without photo resist masking. This allows for a tighter packing of cells than otherwise possible using traditional lithography techniques. However, such tightly packed memory arrays are susceptible to unintentional electrical shorting between the common-source contact and the word-line contact, thus rendering the memory array nonfunctional.

BRIEF SUMMARY

Accordingly, one example aspect of the present invention is a memory array that includes a plurality of memory cells, a word line electrically coupled to the memory cell and a word-line contact. A pair of pillars are positioned parallel to the word line, so that one of the pillars is located on one side of the word-line contact and the other pillar is located on the other side of the word-line contact. The pillars are over a layer of insulating material.

Another example of the present invention is a method to prevent a word-line contact from electrically connecting to a source contact for a plurality of memory cells on a substrate. The method includes etching a gate contact region into the substrate. A depositing step deposits the insulating material into the gate contact region after etching the gate contact region. Another etching step etches the insulating material in the gate contact region to form the layer of insulating material. The method includes forming a pair of pillars over a layer of insulating material on the substrate. A deposition step deposits an electrically conductive gate material between and over the pillars. An etching step etches the gate material such that the gate material partially fills the space between the neighboring pillars in the word-line direction. In this manner, the gate material forms a word line for the memory cells. Each word line is separated from its neighboring word line due to the larger space between pillars in the bit-line direction than in the word-line direction. A depositing step deposits a gate contact between the pair of pillars such that the gate contact is in electrical contact with the gate material.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
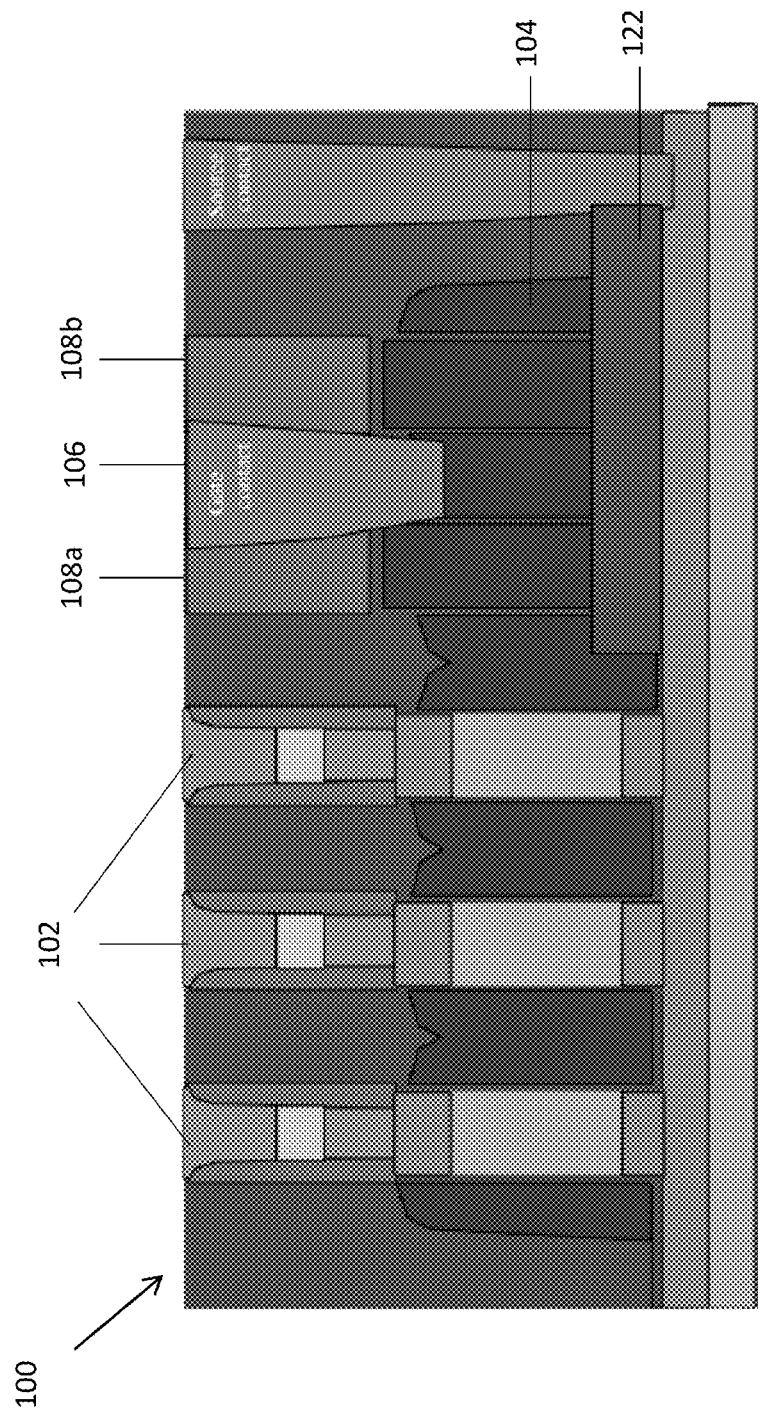
FIG. 1 shows a memory array in accordance with one embodiment of the present invention. The figure is a cutaway view along a word line, showing a plurality of memory cells, a word-line contact, a source contact and a layer of insulating material underneath a pair of dielectric pillars.

The present invention is described with reference to embodiments of the invention. Throughout the description of the invention reference is made to FIGS. 1-5. When referring to the figures, like structures and elements shown throughout are indicated with like reference numerals.

FIG. 1 shows a memory array in accordance with one embodiment of the present invention. In this embodiment, a memory array 100 has a plurality of memory cells 102 and a word line 104 electrically coupled to the plurality of memory cells 102 and a word-line contact 106. Further, a pair of pillars 108a and 108b is positioned parallel to the word line 104 and positioned over a layer of insulating material 122. The insulating material may be made of silicon dioxide.

Figure 2:
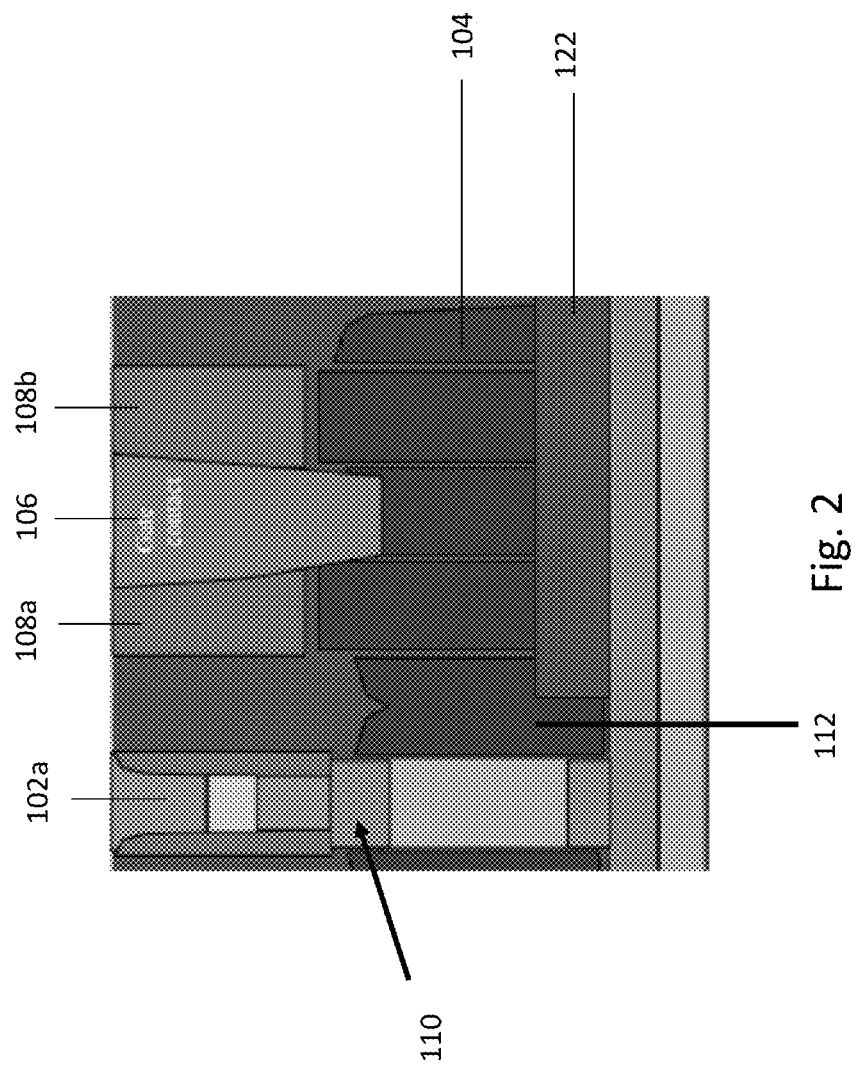
FIG. 2 is a magnified view of the pair of dielectric pillars around a gate contact and an electrical coupling between one of the plurality of memory cells to the word-line contact.
Figure 3:
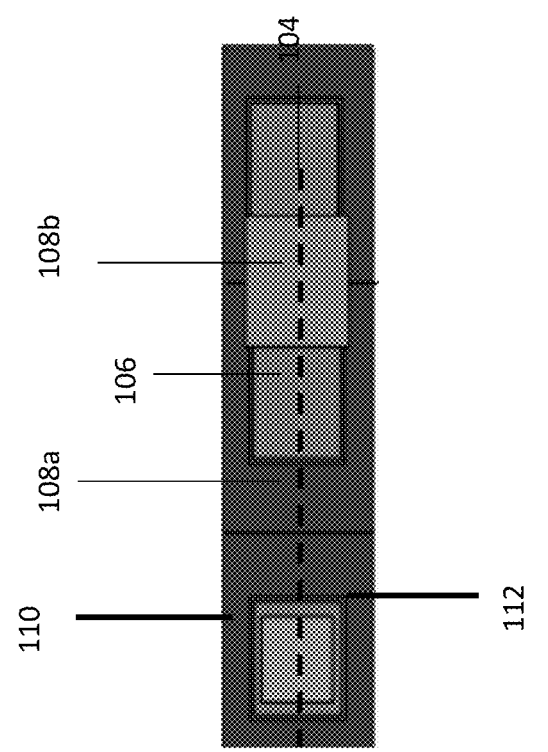
FIG. 3 is an elevation view of the same region as in FIG. 2 without the top insulating layer.

FIG. 2 is a closer view of the pair of pillars around the gate contact and the electrical coupling of a memory cell to the word-line contact in one embodiment of the present invention. A first pillar 108a of the pair of dielectric pillars 108a and 108b is disposed on a first side 106a of the word-line contact 106 and a second pillar 108b of the pair of pillars 108a and 108b is disposed on a second side 106b of the gate contact 106. The pair of pillars 108a and 108b is positioned over the layer of insulating material 122. FIG. 3 is an elevation view of FIG. 2 without the top insulating layer. Referring to FIGS. 2 and 3, a memory cell 102a in the plurality of memory cells 102 may include a vertical access transistor 110. Each vertical access transistor 110 includes a gate terminal 112 electrically coupled to the word-line contact 106. In one embodiment of the invention, the memory cells 102 are phase change memory cells. The phase change memory cells may include $Ge_2Sb_2Te_5$. The phase change memory cells may include $Sb_xTe_{1-x}$ material, where 0.4 $(Sb_2Te_3)<=x<=0.7$ $(Sb_7Te_3)$. The phase change memory cells may include $In_2Se_3$. The vertical access transistor may be a vertical surrounding-gate transistor with a channel diameter of one lithographic size feature.

Figure 4:
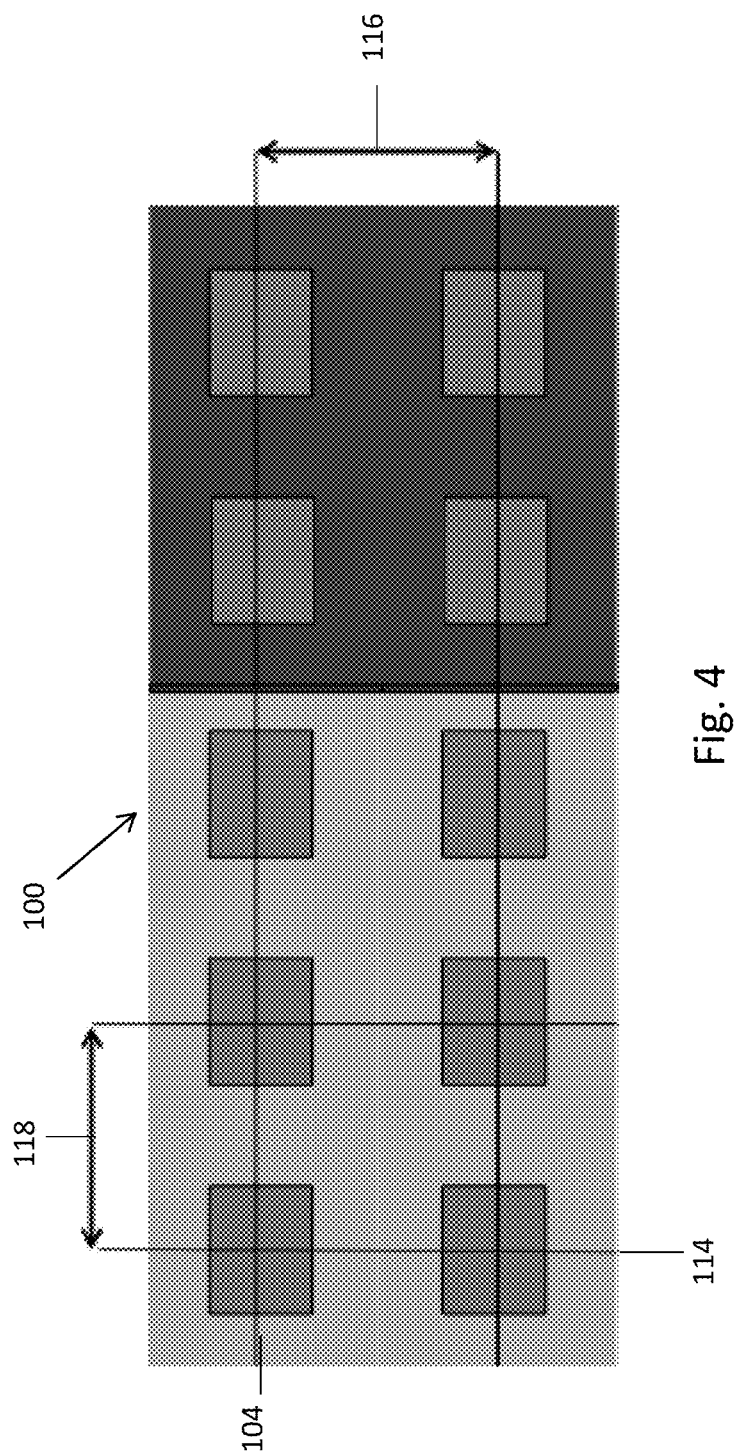
FIG. 4 is an elevation view of the memory array before the gate contact is deposited. This view illustrates relative linear dimensions of word and bit lines.

FIG. 4 is a schematic drawing of an elevation view of one embodiment of the present invention, showing the memory array 100 before the gate contact 106 (see FIG. 3) is deposited. The memory array 100 includes a plurality of bit lines 114. Referring to FIG. 1, each of the bit lines 114 is electrically coupled to one of the plurality of memory cells 102. The bit lines 114 have a bit line pitch 118 and the word lines 104 have a word line pitch 116. The bit line pitch and word line pitch are designed in a way that the space between neighboring pillars in word line direction is smaller than that in bit line direction. Thus, the neighboring word lines are well separated. The bit line pitch 118 of the bit line 114 may be one lithographic feature size less than the word line pitch 116 of the word line 104. In another embodiment of the present invention, each of the bit lines 114 has a bit line pitch 118 of two lithographic feature sizes, and each word line 104 has a word line pitch 116 of three lithographic feature sizes.

Figure 5:
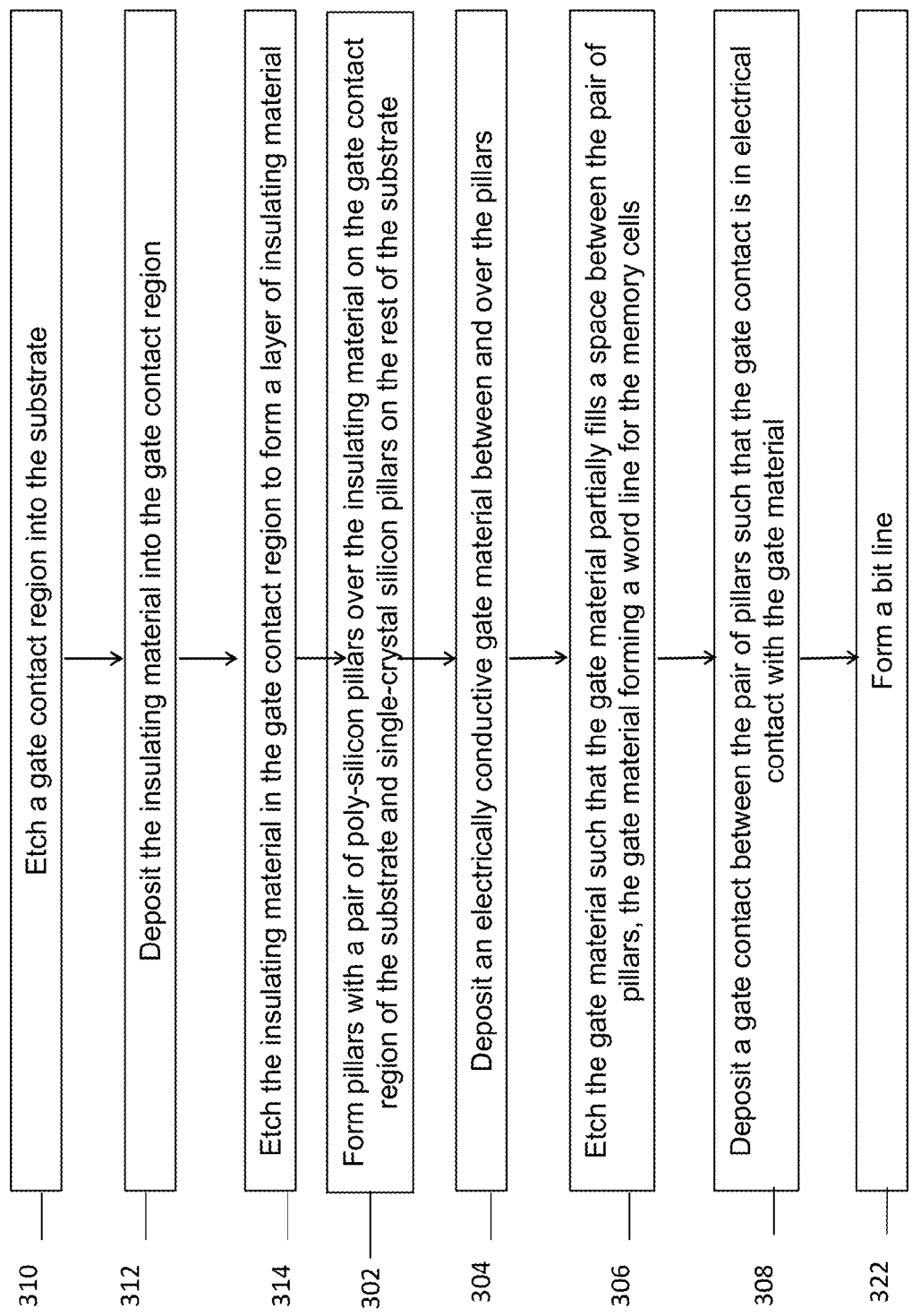
FIG. 5 shows a method to prevent a word-line contact from electrically connecting to a source contact for a plurality of memory cells on a substrate, in accordance with one embodiment of the present invention.

FIG. 5 shows a method to prevent a word-line contact from electrically connecting to a source contact for a plurality of memory cells on a substrate, in accordance with one embodiment of the present invention. The memory cells may be any types of memory cells that require access transistors. In one embodiment, the memory cells may be phase change memory cells. The phase change memory cells may include $Ge_2Sb_2Te_5$. The phase change memory cells may include a $Sb_xTe_{1-x}$ material, where 0.4 $(Sb_2Te_3)<=x<=0.7$ $(Sb_7Te_3)$. The phase change memory cells may include $In_2Se_3$. The memory cells may be comprised of vertical access transistors. One embodiment of the method is a self-aligned integration scheme to build a high-density phase-memory cell with an area of 6 square lithographic feature sizes ($6F^2$) utilizing a vertical transistor as the access transistor. A channel for the vertical access transistor may be formed by silicon pillar etching, which is achieved by etching lines first and then etching lines orthogonal to them. The memory cell may be self-aligned to the drain of the access transistor.

The method includes an etching step 310. In the etching step 310 a gate contact region is etched into the substrate. After the etching step 310 is completed, the next step is a deposition step 312.

In the deposition step 312, the insulating material is deposited into the gate contact region. After the deposition step 312 is completed, the next step is an etching step 314.

In the etching step 314, the insulating material is etched in the gate contact region to form a layer of insulating material. The insulating material may be silicon dioxide. After the etching step 314 is completed, the next step is a formation step 302.

During the formation step 302, polysilicon material is deposited to fill up the trenches in the gate-contact region. This can be achieved by depositing a uniform layer of polysilicon over the substrate followed by Chemical Mechanical Polishing to remove polysilicon in any area but the gate-contact region. With the same masks, pillars are formed across in the substrate with polysilicon pillars in the gate contact region and single-crystal silicon pillars in the rest of the substrate. The polysilicon pillars are dummy pillars for making word-line contact, also known herein as the gate contact. The single-crystal silicon pillars are for building access transistors for memory cells. The polysilicon material may be replaced by any material that has similar etching rate as single-crystal silicon, such as amorphous silicon. After the formation step 302 is completed, the next step is a deposition step 304.

During the deposition step 304, an electrically conductive gate material is deposited between and over the pillars. After the deposition step 304 is completed, the next step is an etching step 306.

During the etching step 306, the gate material is etched such that the gate material partially fills a space between the pair of pillars, the gate material forming a word line for the memory cells. After the etching step 306 is completed, the next step is a deposition step 308.

During the deposition step 308, a gate contact is deposited between the pair of pillars such that the gate contact is in electrical contact with the gate material. After the deposition step 308 is completed, the next step is a formation step 322.

During the formation step 322, a bit line is formed with. In one embodiment of the present invention, a bit line pitch at least one lithographic feature size less than the word line pitch of the word line. In another embodiment of the present invention, the word line has a pitch of 3 lithographic feature sizes and the bit line is formed with a pitch of 2 lithographic feature sizes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method to prevent a gate contact from electrically connecting to a source contact for a plurality of memory cells on a substrate, the method comprising:
   etching a gate contact region into the substrate;
   depositing the insulating material into the gate contact region after etching the gate contact region;
   etching the insulating material in the gate contact region to form the layer of insulating material;
   forming a pair of pillars over the insulating material on the gate contact region of the substrate;
   depositing an electrically conductive gate material between and over the pillars;
   etching the gate material such that the gate material partially fills a space between the pair of pillars, the gate material forming a word line for the memory cells; and
   depositing a gate contact between the pair of pillars such that the gate contact is in electrical contact with the gate material; and
   wherein the memory cells are phase change memory cells.

2. The method as in claim 1, wherein the memory cells include Ge2Sb2Te5.

3. The method as in claim 1, wherein the memory cells include SbTe materials.

4. The method as in claim 1, wherein the memory cells include In2Se3.

5. A method as in claim 1, wherein the insulating material is silicon dioxide.

6. A method as in claim 1, wherein the memory cells include vertical access transistors.

7. A method as in claim 1, further comprising forming a bit line with a pitch at least one lithographic feature size less than the word line pitch.

8. A method as in claim 7, further comprising:
   forming a bit line with a pitch of two lithographic feature sizes; and
   forming the word line with a pitch of three lithographic feature sizes.

9. A method to prevent a gate contact from electrically connecting to a source contact for a plurality of memory cells on a substrate, the method comprising:
   etching a gate contact region into the substrate;
   depositing the insulating material into the gate contact region after etching the gate contact region;
   etching the insulating material in the gate contact region to form the layer of insulating material;
   forming a pair of pillars over the insulating material on the gate contact region of the substrate;
   depositing an electrically conductive gate material between and over the pillars;

etching the gate material such that the gate material partially fills a space between the pair of pillars, the gate material forming a word line for the memory cells; and depositing a gate contact between the pair of pillars such that the gate contact is in electrical contact with the gate material; and forming a bit line with a pitch at least one lithographic feature size less than the word line pitch.

10. The method as in claim 9, wherein the memory cells include Ge2Sb2Te5.

11. The method as in claim 9, wherein the memory cells include SbTe materials.

12. The method as in claim 9, wherein the memory cells include In2Se3.

13. The method as in claim 9, wherein the insulating material is silicon dioxide.

14. The method as in claim 9, wherein the memory cells include vertical access transistors.

15. The method as in claim 9, further comprising:

forming a bit line with a pitch of two lithographic feature sizes; and forming the word line with a pitch of three lithographic feature sizes.

\* \* \* \* \*